United States Patent [19]

Granier et al.

[11] Patent Number: 5,324,892
[45] Date of Patent: Jun. 28, 1994

[54] METHOD OF FABRICATING AN ELECTRONIC INTERCONNECTION

[75] Inventors: Francois J. Granier, Montpellier; Jean-Jacques M. Rieu, Baillargues; Philippe Raout, Saint Selve; Andre Sanchez, Saint Aunes, all of France

[73] Assignee: International Business Machines Corporation, Armonk, N.Y.

[21] Appl. No.: 926,494

[22] Filed: Aug. 7, 1992

[51] Int. Cl.⁵ .............................................. H05K 1/00
[52] U.S. Cl. .................. 174/250; 174/267; 361/760; 228/180.1; 228/180.21; 439/74; 439/83
[58] Field of Search ............. 174/250, 255, 267; 361/403, 412, 413, 418, 760, 784, 785; 29/840; 228/180.1, 180.2; 439/55, 68, 74, 78, 83

[56] References Cited

U.S. PATENT DOCUMENTS

| | | | |
|---|---|---|---|
| 4,545,610 | 10/1985 | Lakritz et al. | 29/589 |
| 4,673,772 | 6/1987 | Satoh et al. | 29/840 |
| 4,705,205 | 11/1987 | Allen et al. | 228/180 |
| 4,724,472 | 2/1988 | Sugimoto et al. | |
| 4,914,814 | 5/1990 | Behun et al. | 29/843 |

OTHER PUBLICATIONS

Ozmar, IBM Technical Disclosure Bulletin, vol. 33, No. 2, Jul. 1990, p. 253, entitled: Thermal Fatigue-Resistant Joint for I/C Packaging Applications.

*Primary Examiner*—Leo P. Picard
*Assistant Examiner*—Cheryl R. Figlin
*Attorney, Agent, or Firm*—Ira David Blecker

[57] ABSTRACT

Disclosed is a method of fabricating an electronic interconnection structure comprising at least one solder column joined to an I/O pad of a substrate, the method including the steps of:
(a) applying a quantity of solder to the solder column or I/O pad;
(b) aligning the solder column with the I/O pad such that there is a quantity of solder between them;
(c) heating the structure to cause the solder to melt and bond the column to the I/O pad; and
(d) planarizing the solder column to a predetermined height.

Also disclosed is the electronic interconnection structure made by the method according to the invention.

16 Claims, 2 Drawing Sheets

METHOD OF FABRICATING AN ELECTRONIC INTERCONNECTION

BACKGROUND OF THE INVENTION

The present invention relates generally to electronic packaging and a method of manufacturing for same, and more particularly, to electrical interconnections between a ceramic substrate carrier and a supporting circuit board, and a process for making such electrical interconnections.

State-of-the-art electronic packaging generally contains many levels of packages and interconnections. The first level package may connect one or more silicon chips on a ceramic substrate carrier. A second level package may interconnect one or more such ceramic substrate carriers on an organic board. In order to achieve high conductivity for power distribution, desirable low electrical inductance for high speed and low noise, proper mechanical properties for acceptable mechanical support, and fatigue characteristics, as well as manufacturability considerations, heretofore ceramic substrate carriers are usually provided with rigid metal pins which are brazed on the ceramic with a suitable braze material such as a gold-tin alloy. Ceramic substrates with such rigid pins are subsequently plugged into a connector or wave soldered to an array of plated through holes on the organic board. The foregoing described connection system has disadvantages of high cost associated with the braze material, the rigid metal pins, the pin connectors or plated through holes, which holes also limit the number of wiring channels available in the board.

IBM Technical Disclosure Bulletin, Vol. 33, No. 2, July 1990, p. 253, the disclosure of which is incorporated by reference herein, proposes an electrical interconnection structure wherein a ceramic carrier and printed circuit board are joined by superplastic solder columns to form a thermal fatigue-resistant joint. The solder columns are actually bonded to the ceramic carrier and printed circuit board by a lower melting solder. As shown in FIG. 1A of this reference, the solder columns are loaded into a graphite fixture which sits upon the ceramic carrier which has previously been screened with the lower melting solder. After solder reflow, the graphite fixture is removed.

The present inventors have discovered, however, that such a fabrication process results in uneven height of the solder columns. There are several reasons for this. One reason is that the solder columns may not all be cut to the same dimension. Another reason is that during reflow, the solder columns are partially supported by the lower melting solder; if the amount of lower melting solder varies from site to site, the solder columns will have different heights. It is desirable to have all solder columns of the same height for maximum thermal fatigue resistance and to insure that the electrical integrity of each Joint is maintained.

Behun et al. U.S. Pat. No. 4,914,814, the disclosure of which is incorporated by reference herein, discloses an in-situ method of forming the solder columns on metallized pads of the ceramic carrier by melting a plurality of solder balls in a graphite mold. Thereafter, the solder columns can be joined to an organic board.

Lakritz et al. U.S. Pat. No. 4,545,610, the disclosure of which is incorporated by reference herein, discloses an in-situ method of forming solder columns between a semiconductor device and a ceramic substrate. Solder portions are formed between the device and carrier. After reflow, columns are formed. To prevent the columns from collapsing during reflow and to maintain proper spacing between the joined parts, stand-offs are placed between the device and carrier.

Allen et al. U.S. Pat. No. 4,705,205, the disclosure of which is incorporated by reference herein, discloses a method of joining two electronic components which may be, for example, a chip carrier and an organic board. Solder preforms (e.g., columns) are placed in a retaining member and the solder preforms are then joined to at least one of the electronic components. The retaining member remains its shape at the temperatures encountered during the joining operation. The retaining member may stay in place after joining or may be made of a material which facilitates its removal after joining.

Accordingly, it is a purpose of the present invention to provide a process for fabricating an array of high density electrical interconnections between a ceramic carrier and a supporting circuit board.

It is also a purpose of the present invention to provide a relatively low cost process for fabricating electrical interconnections between a ceramic carrier and a supporting circuit board.

It is a further purpose of the present invention to provide an improved electrical interconnection for electronic packaging.

It is yet another purpose of the present invention to provide an improved electrical interconnection which could withstand the stresses associated with thermal expansion mismatch between a ceramic carrier and a supporting circuit board.

These and other purposes of the invention will become more apparent after referring to the following description considered in conjunction with the accompanying drawings.

BRIEF SUMMARY OF THE INVENTION

The objects of the invention have been achieved according to a first aspect of the invention disclosing a method of fabricating an electronic interconnection structure comprising at least one solder column Joined to an I/O pad of a substrate, the method comprising the steps of:
 (a) applying a quantity of solder to one of the solder column and I/O pad;
 (b) aligning and contacting the solder column with the I/O pad such that there is a quantity of solder between them;
 (c) heating the structure to cause the solder to melt and bond the column to the I/O pad; and
 (d) planarizing the solder column to a predetermined height.

According to a second aspect of the invention, there is disclosed an electronic interconnection structure comprising:
 (a) a ceramic electronic substrate carrier having at least one I/O pad thereon;
 (b) an organic board having at least one I/O pad thereon;
 (c) a quantity of solder of a first composition on each of the I/O pads; and
 (d) a solder column of a second composition joined between the pad of the ceramic carrier and the pad of the organic board by the first solder alloy wherein the ceramic carrier I/O pad and the organic board I/O pad are at least 10 mils larger in diameter than the diameter of the solder column.

DETAILED DESCRIPTION OF THE INVENTION

Figure 1:
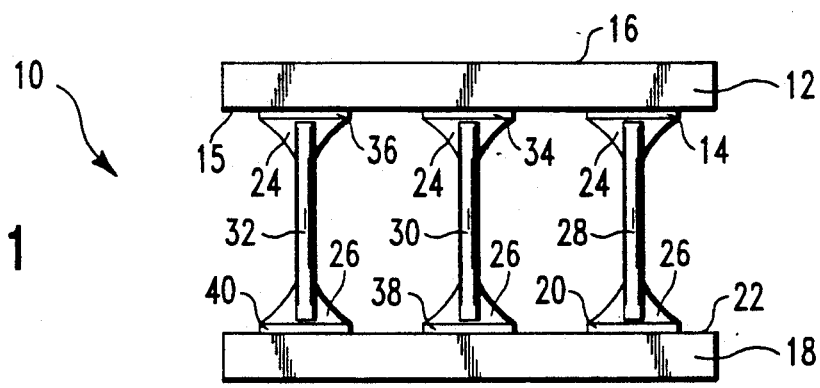
FIG. 1 is a side view of the electronic interconnection structure according to the invention.

Referring to the Figures in more detail, and particularly referring to FIG. 1, there is disclosed according to the present invention an electronic interconnection structure generally indicated by 10. The interconnection structure includes a ceramic substrate carrier 12 having at least one input/output (hereafter I/O) pad 14 on the surface 15 of the carrier. The ceramic substrate carrier 12 is often called a ceramic substrate or a ceramic carrier. All three terms are descriptive of the same article and are used interchangeably herein. The ceramic substrate carrier 12 is ideally suited for making interconnections between a semiconductor device or devices (not shown) typically situated on the top surface 16 of the carrier 12. As such, the ceramic substrate carrier 12 has particular utility in the electronics industry.

The ceramic substrate carrier may be made out of any conventional ceramic material, one example being alumina. The particular material of the ceramic substrate carrier 12 is not important to the present invention.

The electronic interconnection structure 10 further includes an organic board 18 which also has at least one I/O pad 20 on the surface 22 of the organic board 18. The organic board may have additional connection features or connectors (not shown) for making connection with another level of packaging or for plugging directly into a mating connector of an electronic device such as a personal computer. These additional connection features, if any, are well known to those skilled in the art.

The organic board 18 may be made out of any conventional organic material or composite organic material, one example being a composite of fiberglass fibers in an epoxy matrix. The particular material of the organic board 18 is also not important to the present invention.

On I/O pad 14 and I/O pad 20 there is a quantity of solder 24 and 26, respectively.

To complete the electronic interconnection structure 10 is a solder column 28 joined between pad 14 of the ceramic substrate carrier 12 and pad 20 of the organic board 18. The solder column 28 is bonded to pad 14 by solder 24 and to pad 20 by solder 26.

It should be understood that I/O pads 14 and 20 are used for inputting or outputting signals or power between the ceramic substrate carrier 12 and organic board 18. In typical prior art devices, the ceramic substrate carrier 12 would have I/O pins which would mate with suitable connectors in the organic board 18. The pins and mating connectors have been effectively and advantageously replaced by the solder column 28 and I/O pads 14 and 20.

The present inventors have further found, however, that the physical properties of the electronic interconnection structure 10 may be significantly enhanced by proper design of the I/O pads. Thus, the present inventors have found that the best size for ceramic substrate carrier I/O pad 14 and the best size for organic board I/O pad 20 is as shown in Table I.

TABLE I

| Column Diameter, mils | Minimum I/O Pad Size, mils |
|---|---|
| 12 | 22 |
| 16 | 26 |
| 20 | 30 |
| 24 | 34 |
| etc. | etc. |

While the present invention has utility where there is only one solder column 28 and only one I/O pad on each of the ceramic substrate carrier 12 and organic board 18, the electronic interconnection structure more typically will have a plurality of I/O pads and solder columns. Thus, as shown in FIG. 1, there are additional solder columns 30 and 32, additional ceramic substrate carrier I/O pads 34 and 36, and additional organic board I/O pads 38 and 40. There, of course, may be many more than the three solder columns and adjoining I/O pads shown in FIG. 1. Further, the I/O pads on the ceramic substrate carrier 12 will usually, but not necessarily, be complementary in number with the I/O pads on the organic board 18.

For ease of assembly, the compositions of the solder and solder columns will differ as will be explained in more detail hereafter. Suffice it to say here that the solder will be of a first composition and the solder column will be of a second composition wherein the melting point of the second composition will be greater than the melting point of the first composition. Except for eutectic solders, it is more correct to say that the solders have a melting range; hereinafter, whenever melting point is mentioned, it shall be inclusive of melting range as well. The solder on the ceramic substrate carrier I/O pads 14, 34, 36 may be the same or different from that of the solder on the organic board I/O pads 20, 38, 40 just so long as both of these solders have a melting point which is less than that of the solder column.

Figure 2:
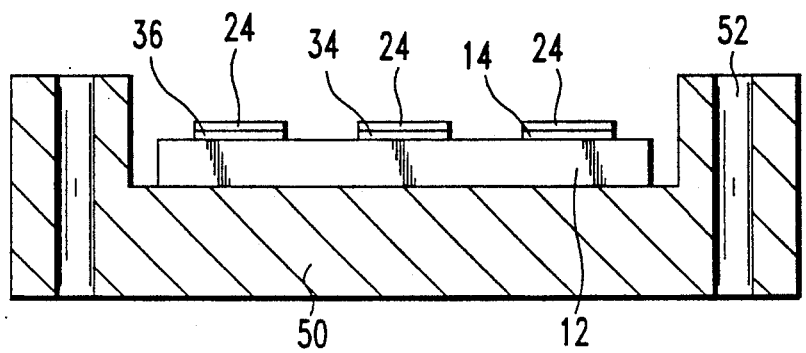
FIGS. 2 through 6 illustrate the method of fabricating an electronic interconnection structure according to the invention.

Referring now to FIGS. 2 to 6, the method according to the present invention will be described in detail. In FIG. 2, ceramic substrate 12 is placed in furnace fixture 50 which is typically made of carbon. The ceramic substrate 12 has I/O pads 14, 34, 36. For purposes of illustration and not limitation, FIG. 2 shows a quantity of solder 24 being deposited on each of the I/O pads 14, 34, 36. While it is preferred to deposit the solder 24 on the I/O pads 14, 34, 36, the solder could also be deposited on the solder columns. The present invention includes both alternatives. Furnace fixture 50 also includes fastener holes 52.

Figure 3:
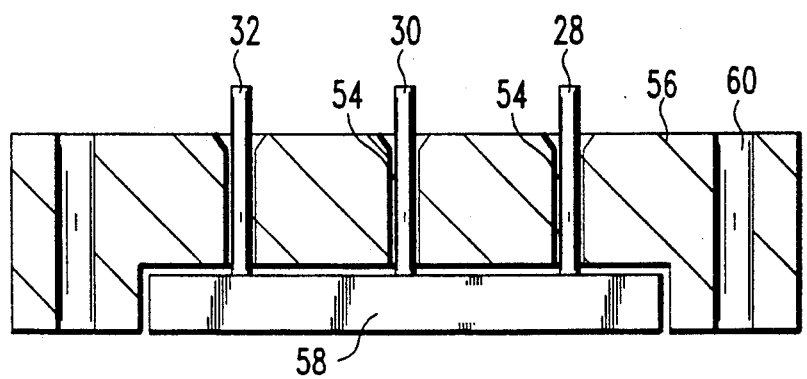

In FIG. 3, solder columns 28, 30, 32 are placed in holes 54 of furnace fixture 56. The holes 54 may be tapered at the top for easier insertion of the solder columns 28, 30, 32. Normally, solder columns 28, 30, 32 will fit into holes 54 with a close tolerance so that there is very little movement of the solder columns 28, 30, 32 within the holes 54, thereby aiding in the later precise alignment of the solder columns 28, 30, 32 with the ceramic substrate 12. The solder columns 28, 30, 32 are somewhat longer than the length of the holes 54 so that the solder columns 28, 30, 32 protrude from the holes 54. The solder columns 28, 30, 32 rest upon plate 58. Furnace fixture 56 and plate 58 may conveniently be made from carbon. Furnace fixture 56 also includes fastener holes 60.

It is unimportant to the present invention how the solder columns 28, 30, 32 are made. For example, the solder composition appropriate for solder columns may be made into a wire form and then solder columns of the appropriate length may be simply cut from the spool of wire. Alternatively, additional heat and mechanical treatment may be done to the solder columns to give them superplastic properties.

Figure 4:
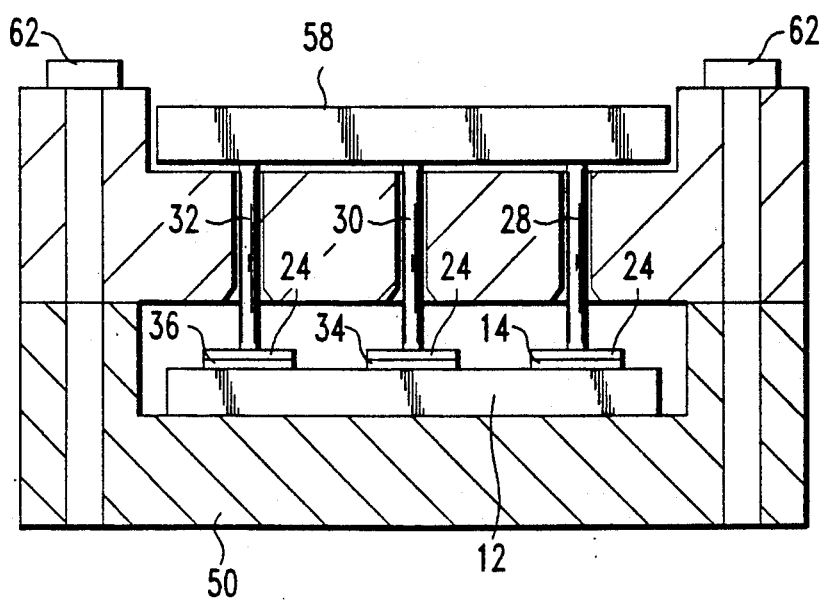

Referring now to FIG. 4, furnace fixture 56 is inverted and placed in juxtaposition with furnace fixture 50. Solder columns 28, 30, 32 are carefully aligned and contacted with I/O pads 14, 34, 36 respectively. Contact of solder colums 28, 30, 32 with I/O pads 14, 34, 36, respectively, is indirect since there is a quantity of solder 24 between each of the solder columns and the I/O pads. The furnace fixtures 50, 56 are held together by fasteners 62 placed in fastener holes 52 and 60. The structure thus formed is placed into a suitable furnace so that the structure is heated, thereby causing solder 24 to melt and bond the solder columns 28, 30, 32 to I/O pads 14, 34, 36. Carbon plate 58 serves to apply a downward force to the solder columns so that they make good contact with the I/O pads.

Figure 5:
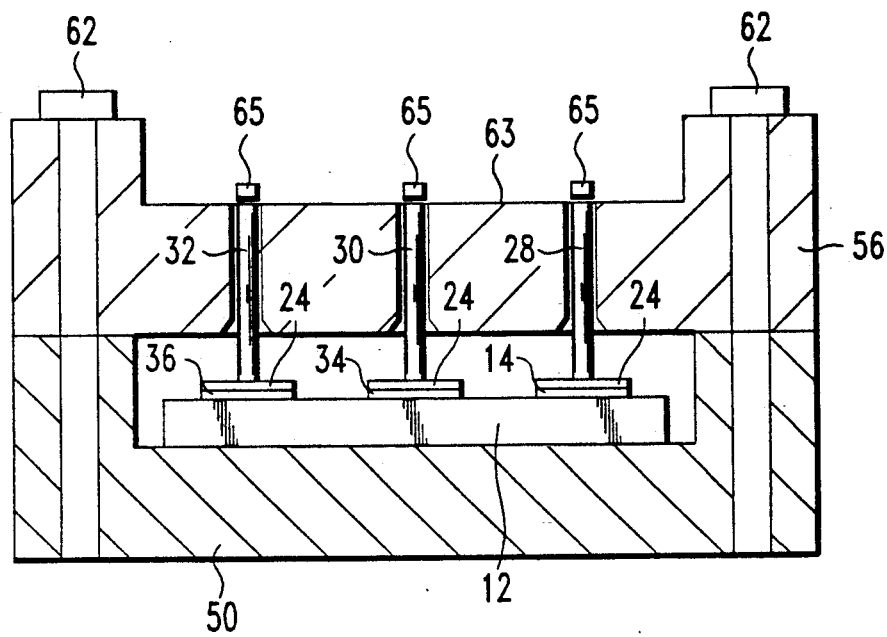

Thereafter, the structure is removed from the furnace and allowed to cool somewhat. Carbon plate 58 is removed. It is noticed that, as is often the case, the solder columns 28, 30, 32 protrude an unequal amount above the surface 63 of furnace fixture 56. It is desirable to have all of these solder columns the same height. Now, in a further inventive step as shown in FIG. 5, the solder columns 28, 30, 32 are planarized to a predetermined height, in this case so as to be even with surface 63 of furnace fixture 56 by removing that part 65 of each solder column that protrudes above surface 63. The planarization may be accomplished by any number of methods such as cutting or grinding. Cutting by a sharp instrument, for example a knife or razor blade, is preferred.

Figure 6:
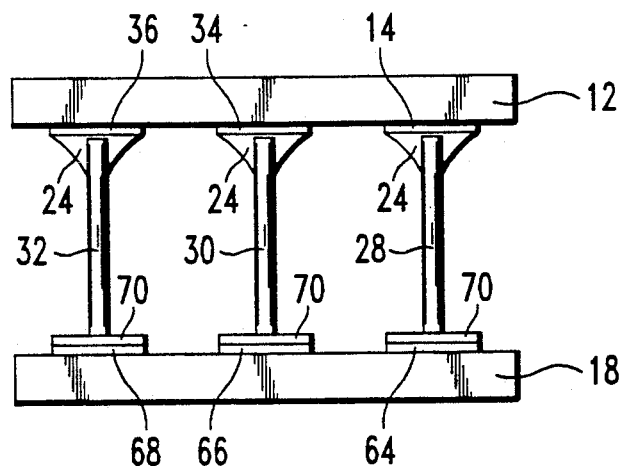

It is ultimately desirable to join a second substrate to the ceramic substrate 12 having the solder columns 28, 30, 32 bonded to it. In this case, fasteners 62 and furnace fixture 56 are removed. Ceramic substrate 12 may then be removed from furnace fixture 50. The second substrate may be an organic board 18 having I/O pads 64, 66, 68. A quantity of solder 70 is applied to either the unjoined end of the solder columns 28, 30, 32 or to I/O pads 64, 66, 68. As shown in FIG. 6, the ceramic substrate 12 is placed over organic board 18 and the unjoined end of the solder columns 28, 30, 32 are aligned with I/O pads 64, 66, 68. The structure so formed is then placed into a furnace or other reflow process, e.g., vapor phase. The structure can be clamped or not with suitable conventional fixturing during the reflow. Upon cooling, the structure is unclamped and the interconnection structure is finished. Further processing may then be done on the organic board 18 for Joining to the next level of packaging.

Due to the planarization of the solder columns to the same height, organic board 18 is parallel to ceramic carrier 12. As a result, good electrical contact of all the Joints is maintained and the fatigue resistance of the structure is enhanced.

It is preferable for the best working of the invention that the melting points of the solder columns and solders 24, 70 maintain certain temperature relationships. Thus, it is preferred that the solder columns have a melting point greater than that of the solders 24, 70. This is desirable so that the solder columns do not melt and deform during the reflow operations for solders 24, 70. More particularly, the solder columns should have a melting point greater than about 250° C. and the solders 24, 70 should have a melting point less than about 240° C. It is also preferred that solder 24 have a melting point greater than that of solder 70 so that solder 24 does not melt during the reflow of solder 70 which could cause distortion in the structure. Nevertheless, identical solders 24, 70 work well.

The composition of the solder columns and solders is important so that they have adequate thermal and fatigue resistance. Conventional lead-tin solder compositions have been found to work fine. It is at least equally important that the solders maintain the temperature relationships just discussed.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of fabricating an electronic interconnection structure comprising at least one solder column joined to an I/O pad of a substrate, the method comprising the steps of:
    (a) applying a quantity of solder to one of the solder column and I/O pad;
    (b) aligning and contacting the solder column with the I/O pad such that there is a quantity of solder between them;
    (c) heating the structure to cause the solder to melt and bond the column to the I/O pad; and
    (d) planarizing the solder column to a predetermined height.

2. The method of claim 1 wherein there are a plurality of the solder columns which are planarized to a predetermined height.

3. The method of claim 1 wherein there is a second substrate having at least one I/O pad, the method further comprising:
    (e) applying a quantity of solder to one of the unjoined end of the solder column and the I/O pad of the substrate;
    (f) aligning and contacting the unjoined end of the solder column with the connection pad such that there is a quantity of solder between them; and
    (g) heating the structure to cause the solder in step (e) to melt and bond the solder column to the I/O pad.

4. The method of claim 1 wherein the solder column has a melting point greater than the melting point of the solder.

5. The method of claim 3 wherein the solder column has a melting point greater than the melting point of the solders in steps (a) and (e).

6. The method of claim 5 wherein the solder column has a melting point greater than 250° C. and the solders in steps (a) and (e) have a melting point less than 240° C.

7. The method of claim 5 wherein the solder in step (a) has a melting point greater than the melting point of the solder in step (e).

8. The method of claim 3 wherein the first substrate is a ceramic substrate carrier and the second substrate is an organic board.

9. A method of fabricating an electronic interconnection structure comprising at least one solder column Joined to an I/O pad of a substrate, the method comprising the steps of:

(a) placing the solder column into a complementary cavity of a furnace fixture, the cavity having approximately the same width but smaller height as the solder column so that the solder column protrudes from the cavity;

(b) applying a quantity of solder to one of the solder column and I/O pad;

(c) aligning and contacting one end of the solder column with the I/O pad such there is a quantity of solder between them and the other end of the solder column protruding from the fixture;

(d) heating the structure to cause the solder to melt and bond the solder column to the I/O pad; and (e) planarizing the solder column even with the surface of the furnace fixture by removing that portion of the solder column that protrudes from the fixture.

10. The method of claim 9 wherein there are a plurality of the solder columns which are planarized to the same predetermined height.

11. The method of claim 9 wherein there is a second substrate having at least one I/O pad, the method further comprising:

(f) applying a quantity of solder to one of the unjoined end of the solder column and the I/O pad of the substrate;

(g) aligning and contacting the unjoined end of the solder column with the connection pad such that there is a quantity of solder between them; and (h) heating the structure to cause the solder in step (f) to melt and bond the solder column to the I/O pad.

12. The method of claim 9 wherein the solder column has a melting point greater than the melting point of the solder.

13. The method of claim 11 wherein the solder column has a melting point greater than the melting point of the solders in steps (b) and (f).

14. The method of claim 13 wherein the solder column has a melting point greater than 250° C. and the solders in steps (b) and (f) have a melting point less than 240° C.

15. The method of claim 13 wherein the solder in step (b) has a melting point greater than the melting point of the solder in step f.

16. The method of claim 11 wherein the first substrate is a ceramic substrate carrier and the second substrate is an organic board.

* * * * *